United States Patent [19]

Takekoshi et al.

[11] Patent Number: 4,841,320
[45] Date of Patent: Jun. 20, 1989

[54] DEVELOPING DEVICE FOR PHOTOSENSITIVE MATERIAL

[75] Inventors: Tomoaki Takekoshi; Hisao Ohba; Kenji Kunichika, all of Shizuoka, Japan

[73] Assignee: Fuji Photo Film Co., Ltd., Minami-Ashigara, Japan

[21] Appl. No.: 137,076

[22] Filed: Dec. 23, 1987

[30] Foreign Application Priority Data

Dec. 23, 1986 [JP] Japan ................... 61-307054

[51] Int. Cl.$^4$ .............................. G03D 5/04
[52] U.S. Cl. ................... 354/299; 354/317; 354/325; 118/119; 118/325
[58] Field of Search ............ 354/299, 317, 324, 325; 118/119, 325

[56] References Cited

U.S. PATENT DOCUMENTS

| | | | |
|---|---|---|---|
| 3,903,541 | 9/1975 | Von Meister et al. | 354/317 |
| 4,145,135 | 3/1979 | Sara | 354/317 |
| 4,222,656 | 9/1980 | Harrell et al. | 354/325 |
| 4,327,987 | 5/1982 | Friar et al. | 354/317 |
| 4,573,782 | 3/1986 | Kobayashi et al. | 354/325 |
| 4,627,698 | 12/1986 | Yamasaki et al. | 354/317 |
| 4,737,810 | 4/1988 | Kobayashi et al. | 354/325 |

Primary Examiner—A. A. Mathews
Attorney, Agent, or Firm—Burns, Doane, Swecker & Mathis

[57] ABSTRACT

A devleoping device for photosensitive materials, particularly, for photosensitive materials used flat printing plates, in which the consumption rate of the developing solution is significantly reduced. The developing solution is applied to the exposed surface of the heated photosensitive material and excess portions thereof quickly removed before the temperature of the photosensitive material is significantly lowered or the temperature of the developing solution significantly raised. The excess portons of the developing solution are recycled.

9 Claims, 1 Drawing Sheet

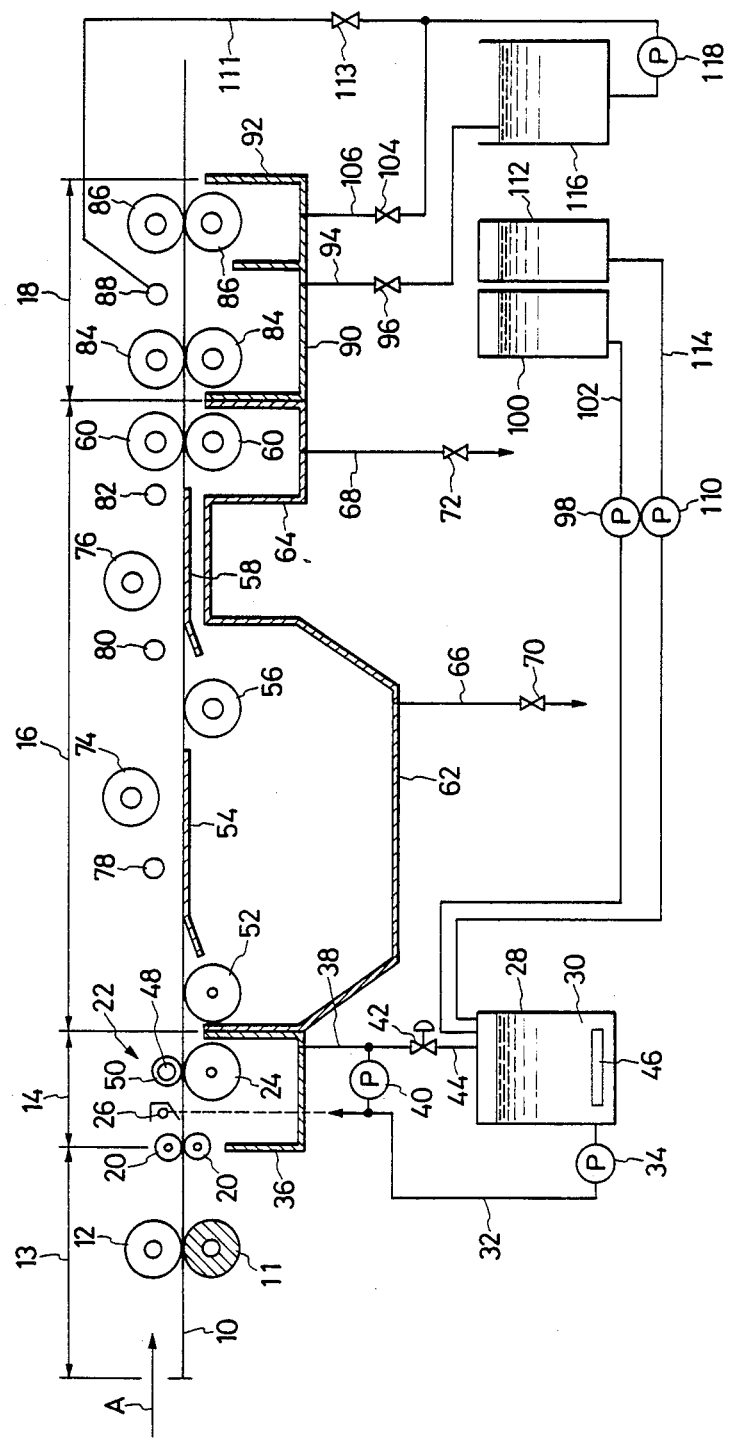

DEVELOPING DEVICE FOR PHOTOSENSITIVE MATERIAL

BACKGROUND OF THE INVENTION

The present invention relates to a device for developing an exposed photosensitive material using a developing solution. More particularly, the invention relates to a developing device for photosensitive material appropriate for producing planographic printing plates.

In a conventional high-volume developing device for processing planographic printing plates, the photosensitive material is conveyed by a plurality of pairs of rollers. During such conveyance, a developing solution is applied to the exposed surface of the photosensitive material using a sprayer or the like to develop the photosensitive material. After the exposed (or unexposed, as the case may be) portion of the photosensitive layer of the photosensitive material is dissolved or swelled by the developing solution, that portion of the photosensitive material is rubbed off with a brush.

The efficiency of the developing process can be enhanced by heating the developing solution. In such a case, however, if the developing solution is alkaline, it has a tendency to absorb carbon dioxide from the ambient air at a high rate. This cause rapid fatigue of the developing solution due to a resulting drop in the degree of alkalinity of the solution as a result of a neutralizing reaction with the carbon dioxide.

In order to overcome this problem, a technique involving applying only the minimal amount of developing solution and rubbing off the dissolved portions of photosensitive material has been proposed, for example, in U.S. Pat. No. 4,222,656. Unfortunately though, it has been found that incomplete development and contamination in printing are likely to occur.

SUMMARY OF THE INVENTION

Accordingly, it is an object of the present invention to overcome the above-described drawbacks.

More specifically, it is an object of the present invention to provide a photosensitive material developing device in which the developing solution is less quickly fatigued, even if the solution is heated to enhance the efficiency of development, and hence in which the consumption rate of the developing solution is significantly reduced.

In accordance with these and other objects, the invention provides a photosensitive material developing device comprising warming means for raising the temperature of a photosensitive material being developed, measuring means for applying only a necessary minimum quantity of developing solution to the exposed surface of the photosensitive material, and a developing section for developing the photosensitive material with the developing solution applied by the measuring means.

That is, in accordance with the invention, the temperature of the photosensitive material is raised by the warming means. The developing solution is then applied to the photosensitive material in such a manner that precisely a prescribed amount of the solution is left on the photosensitive material while excess amounts are removed. The length of the photosensitive material in which the temperature is raised and the prescribed quantity of the developing solution applied are set such that the temperature of the photosensitive material is not significantly lowered by the presence of the developing solution, the photosensitive material is not developed by the developing solution in the heated section, and the applied developing solution is evenly spread over the photosensitive material. With this arrangement, the developing solution removed from the heated section is not fatigued due to development of the photosensitive material, allowing the developing solution to be recycled.

Development of the photosensitive material takes place in the developing section. Since the temperature of the developing solution used in the developing section is raised by the heat of the photosensitive material, the developing efficiency is high. Since the developing solution used in the developing solution is relatively rapidly fatigued du the developing reaction with the photosensitive material and contact of the solution with the ambient air, the developing solution from the developing section should generally be discarded.

Since the recycled developing solution is not fatigued and the developing solution used in the developing section is discarded, completely unfatigued developing solution is always supplied to the photosensitive material, thereby making the developing process very stable. Moreover, since the quantity of developing solution discarded after developing is very small, the total rate of consumption of the developing solution is low.

The warming means may be constituted by a heater disposed in contact with the lower surface of the photosensitive material, or it may be located over or under the photosensitive material, out of contact with the photosensitive material.

BRIEF DESCRIPTION OF THE DRAWINGS

The single drawing figure is a sectional view of a photosensitive material developing device constructed in accordance with the present invention.

DESCRIPTION OF THE PREFERRED EMBODIMENTS

Preferred embodiments of the invention will now be described with reference to the attached drawing.

In the single drawing figure, there is shown a photosensitive material developing device embodying the present invention. A sheet of photosensitive material 10 carrying an exposed image is conveyed in a direction A. The temperature of the photosensitive material 10 is raised while the material is pinch-conveyed by a heating roller 11 and a guide roller 12.

If, for instance, the photosensitive material 10 is a presensitized plate whose base is formed by an aluminum sheet, the specific heat of the material is sufficiently low that temperature of the material can easily be raised.

It should be noted, however, that it is not necessary to provide a heater for raising the temperature of the developing solution directly, or a device to control the temperature of the photosensitive material 10 prior to the developing solution being supplied thereto, and hence there is present no heater or related device which could be contaminated with the developing solution.

Instead of the heated roller 11 it is possible to employ a lattice-shaped heater, a panel heater, an infrared heater, a high-frequency heater, an electromagnetic induction heater, a ceramic heater, or other such heating device. The heating device may be disposed in contact with the lower surface of the photosensitive material, or located over or under the photosensitive material with a small gap therebetween.

The photosensitive material 10 is automatically developed in a second section 14, a third section 16 and a fourth section 18.

In the second section 14, the photosensitive material 10 is pinch-conveyed by a pair of guide rollers 20 so that the photosensitive material 10 is pinched between a wire bar 22 and a guide roller 24 which contacts the wire bar 22. A sprayer 26, through which developing solution is supplied to the exposed surface of the photosensitive material 10, is disposed immediately downstream of the guide rollers 20. Developing solution is supplied to the sprayer 26 from a tank 28 via a pipe 32 and a pump 34.

A tray 36 is provided under the second section 14 to collect the excess developing solution. Developing solution collected in the tray 36 is recycled to the sprayer 26 through a pipe 38, a pump 40 and the pipe 32. A pipe 44 provided with a valve 42 is connected o the pipe 38 to return developing solution from the tray 36 to the storage tank 28 when development of all photosensitive materials 10 has been completed. If necessary, a heater 46 may be provided in the storage tank 28 to maintain the developing solution 30 at a prescribed temperature.

The wire bar 22 is composed of a shaft 48 and a wire 50 having a prescribed diameter. The wire 50 is spirally and tightly wound on the shaft 48. The rate at which the developing solution is supplied to the surface of the photosensitive material 10 is determined by the gap defined between the peripheral surface of the wire and the guide roller 24. That is, a developing solution metering device is constituted by the wire bar 22 and the guide roller 24. The dimensions of the gap between the wire surface and the guide roller 24 are preferably set so that the thickness of the developing solution film left on the surface of the photosensitive material is 300 $\mu$m or less.

The photosensitive material 10 to which developing solution has been applied in the above-described manner is conveyed on to the third section 16 by the wire bar 22 and guide roller 24, while excess amounts of developing solution are removed and drop into the tray 36.

The length of the second section 14 is such that the temperature of the photosensitive material 10, which has been raised by preferably 15° C., or more preferably 25° C. or greater, by the heating roller 11 is not significantly reduced. As a result, the temperature of the developing solution carried on the surface of the photosensitive material does not significantly develop the photosensitive material prior to its reaching the wire bar 22 and there being spread over the entire width of the surface of the photosensitive material. The decrease in the amount of the photosensitive solution in the storage tank 28 is offset by supplying secondary water to the storage tank 28 from a supplementary water tank 100 by a pump 98 and supplementary developing solution from a supplementary developing solution supply tank 112 through a pipe 110, with the relative quantities of supplemental water and supplemental developing solution being adjusted so as to maintain a prescribed concentration of the developing solution in the storage tank 28.

In the third section 16, the photosensitive material 10 conveyed from the second section 14 is guided onto a guide plate 54 by a guide roller 52, guided onto a guided plate 58 by a guide roller 56, and then transferred to a pair of squeeze rollers 60. The prescribed quantity of the developing solution remaining on the photosensitive material 10 is warmed by the heat of the photosensitive material in the third section 16 to thus raise the degree of developing activity of the developing solution to thereby more efficiently develop the photosensitive material. A tray 62 is provided under the squeeze rollers 60. Pipes 66 and 68 are connected to the bottoms of the trays 62 and 64, respectively, through which the developing solution collected in the two trays is discharged when the valves 70 and 72 are opened.

Brush rollers 74 and 76, which are movable up and down, are provided over the guide plates 54 and 58. The brush rollers 74 and 76 are moved toward the guide plates and rotated against the surface of the developed photosensitive material to remove remaining developed photosensitive material. It is not always necessary, however, to provide the brush roller 74 and 76. Also, it may be desirable in some embodiments to provide sprayers 78 and 80 upstream of the brush rollers 74 and 76 to wash the brush rollers. Further, it may be considered to employ a sprayer 82 upstream of the squeeze rollers 60 to wash the latter.

In the fourth section 18, the photosensitive material 10 is subjected to a finishing treatment after development. The photosensitive material 10 is conveyed between pairs of guide rollers 84 and 86. A spray nozzle 88 is provided to perform a finishing treatment on the photosensitive material 10 conveyed between the pair of guide rollers 84 and 86.

Trays 90 and 92 are provided under the fourth section 18. The tray 92 is connected to a storage tank 116 through a pipe 106, a valve 104 and a pump 118, the latter functioning to supply a finishing agent from the storage tank 116 to the spray nozzle 88 through a valve 113 and a pipe 111.

The storage tank 28 is connected to a pipe 114 extending from the supplementary developing solution tank 112 and provided with a pump 110 at the midsection of the pipe 114.

The various guide rollers and the squeeze rollers disposed along the conveyance path of the photosensitive material are rotated by an external drive source (not shown).

The operation of the above embodiment of the inventive developing device will now be described in detail.

After the photosensitive material 10 has been exposed to the image light, the photosensitive material 10 is conveyed in the direction A and pinched between the heated roller 11 and the guide roller 12 so as to raise the temperature of the photosensitive material. Then, the photosensitive material 10 is forwarded to the second section 14 via the guide rollers 20. In the second section, the developing solution 30 is applied to the photosensitive material 10 by the sprayer 26. The length of the second section is sufficiently short that the developing solution does not, in the passage of the photosensitive material through the second section, absorb enough heat from the photosensitive material to significantly lower the temperature of the photosensitive material or significantly raise the temperature of the developing solution. Accordingly, the excess developing solution, which is removed by the wire bar 22 and recycled via the sprayer 26 through the pipe 38, the pump 40 and the pipe 32, is not fatigued because the photosensitive material is not developed to any great extent. Moreover, since the area of contact between the developing solution and the atmosphere is small, fatigue due to absorption of carbon monoxide is minimized.

The prescribed quantity of the developing solution is spread uniformly over the surface of the photosensitive material by the wire bar 22. For this purpose, the wire bar 22 may either be rotated or held stationary. When the passing of the rear end of the photosensitive material 10 is detected by a sensor (not shown), the application of the developing solution 30 from the sprayer 26 is stopped.

In the third section 16, the photosensitive material 10 is gradually developed while being conveyed to the squeeze rollers 60. The time for the photosensitive material 10 to move through the third section 16 can be controlled by controlling the speed of the guide rollers. In the third section, sufficient heat is transferred from the photosensitive material 10 to the developing solution to raise its temperature sufficiently to enhance the efficiency of the developing process. Although this of course fatigues the developing solution, there is no difficulty since the fatigued developing solution from the third section is merely drained away and discarded via the pipe 68 and the valve 72.

The developed photosensitive material is removed from the developing solution by action of the squeeze rollers 60, and the spent developing solution drops into the tray 64 and is drained off through the pipe 68 and the valve 72.

Since the squeeze rollers 60 are continuously kept clean by water from the sprayer 82, the developing solution is positively removed from the photosensitive material 10 by the action of the squeeze rollers so that the photosensitive material with the developing solution removed is passed to the fourth section 18.

The fatigued developing solution is drained away via the pipes 66 and 68 and discarded. Hence, no fatigued developing solution is recycled through the sprayer 26. Since the photosensitive material 10 is stably developed in the third section 16 by the unfatigued developing solution applied to the photosensitive material in the second section 14 as metered by the wire bar 22, the efficiency of the developing process performed by the apparatus of the present invention is quite high.

The photosensitive material passed through the squeeze rollers and into the fourth section is treated with the finishing agent applied with the sprayer 88, whereafter the finishing agent is removed and the developed photosensitive material passed out of the fourth section by the guide rollers 86. The entire development process of the photosensitive material is thus completed.

However, it should be noted that further treatments can be performed in the fourth section 18 if desired, for instance, a desensitizing treatment or a water-washing treatment.

As described above, a photosensitive material developing device constructed in accordance with a preferred embodiment of the present invention includes a warming device for raising the temperature of the photosensitive material prior to the developing solution being applied thereto, a device for measuring out and applying only a minimum necessary amount of the developing solution to the exposed surface of the photosensitive material, and a developing section for developing the photosensitive material with the developing solution applied by the developing solution measuring and applying device. With the inventive arrangement, the temperature of only the minimal amount of developing solution is raised to enhance the efficiency of the developing process, as a result of which the rate at which the developing solution is fatigued is reduced. Also, it is ensured that the photosensitive material is always developed with nonfatigued developing solution, thereby providing a stable developing process.

What is claimed is:

1. A device for developing a photosensitive material, comprising: warming means for raising the temperature of said photosensitive material; measuring means for applying only a minimum necessary amount of a developing solution for effecting development to an exposed surface of said photosensitive material; and a developing section for developing said photosensitive material with said developing solution applied by said measuring means and wherein the warmed photosensitive material heats the developing solution which is applied thereon sufficiently to enhance the development of the photosensitive material within said developing section.

2. The developing device of claim 1, wherein said warming means comprises a heater disposed in contact with a bottom surface of said photosensitive material upstream of said measuring means.

3. The developing device of claim 1, wherein said warming means comprises a heater disposed adjacent said photosensitive material out of contact therewith upstream of said measuring means.

4. A device for developing a photosensitive material comprising: means for raising the temperature of said photosensitive material; means for applying a developing solution to an exposed surface of said photosensitive material; means for removing excess portions of said developing solution from said exposed surface of said photosensitive material; a developing section for developing said photosensitive material with said developing solution applied by said developing solution applying means; and means for transporting said photosensitive material through said device, wherein the period of time said photosensitive material is transported between said applying means and said removing means is set such that the temperature of said photosensitive material is not substantially lowered and the temperature of said developing solution is not substantially raised prior to said removing means and further wherein the warmed photosensitive material sufficiently raises the temperature of the developing solution prior to the developing section so as to enhance the developing of the photosensitive material.

5. The developing device of claim 4, further comprising means for collecting excess developing solution removed by said removing means, and means for recycling the collected excess developing solution to said developing solution applying means.

6. The developing device of claim 6, further comprising means for removing all developing solution from said photosensitive material in said developing section following development of said exposed surface of said photosensitive material; and means for collecting and discarding the removed developing solution.

7. The developing device of claim 4, further comprising means for performing at least one finishing treatment on said photosensitive material subsequent to said developing section.

8. The developing device of claim 4, wherein said means for removing said excess portions of said developing solution comprises a guide roller and a wire bar disposed parallel to one another.

9. The developing device of claim 8, wherein a gap between said guide roller and said wire bar is set so as to leave a film of said developing solution on said exposed surface of said photosensitive material having a thickness of no more than 300 $\mu$m.

* * * * *